(12) United States Patent
Chen et al.

(10) Patent No.: US 10,446,503 B2
(45) Date of Patent: Oct. 15, 2019

(54) METHODS FOR FORMING SHIELDED RADIO-FREQUENCY MODULES HAVING REDUCED AREA

(71) Applicant: SKYWORKS SOLUTIONS, INC., Woburn, MA (US)

(72) Inventors: Howard E. Chen, Anaheim, CA (US); Matthew Sean Read, Foothill Ranch, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 84 days.

(21) Appl. No.: 15/701,643

(22) Filed: Sep. 12, 2017

(65) Prior Publication Data

US 2018/0005958 A1 Jan. 4, 2018

Related U.S. Application Data

(62) Division of application No. 14/869,952, filed on Sep. 29, 2015, now Pat. No. 9,761,537.

(Continued)

(51) Int. Cl.
*H01L 23/552* (2006.01)
*H01L 23/66* (2006.01)
*H01L 23/00* (2006.01)

(52) U.S. Cl.
CPC ............ *H01L 23/552* (2013.01); *H01L 23/66* (2013.01); *H01L 24/05* (2013.01); *H01L 24/06* (2013.01);

(Continued)

(58) Field of Classification Search
CPC ....... H01L 23/552; H01L 23/66; H01L 24/05; H01L 24/06; H01L 24/85; H01L 24/45;

(Continued)

(56) References Cited

U.S. PATENT DOCUMENTS 7,084,487 B1 * 8/2006 Conn ...................... H01L 24/24
257/660
2005/0040501 A1 2/2005 Hagen (Continued)

OTHER PUBLICATIONS

International Search Report and Written Opinion for PCT/US2015/052850 dated Feb. 24, 2016.

*Primary Examiner* — Yasser A Abdelaziez
(74) *Attorney, Agent, or Firm* — Chang & Hale LLP (57) ABSTRACT

Shielded radio-frequency (RF) module having reduced area. In some embodiments, a method for fabricating a radio-frequency module includes forming or providing a packaging substrate configured to receive a plurality of components. The method may include mounting one or more devices on the packaging substrate such that the packaging substrate includes a first area associated with mounting of each of the one or more devices. In some embodiments, the method further includes forming a plurality of shielding wirebonds on the packaging substrate to provide RF shielding functionality for one or more regions on the packaging substrate, such that the packaging substrate includes a second area associated with formation of each shielding wirebond, the mounting of each device implemented with respect to a corresponding shielding wirebond such that a portion of the first area associated with the device overlaps at least partially with a portion of the second area associated with the corresponding shielding wirebond.

20 Claims, 8 Drawing Sheets

Related U.S. Application Data (60) Provisional application No. 62/058,039, filed on Sep. 30, 2014.

(52) U.S. Cl.
CPC .............. H01L 24/45 (2013.01); H01L 24/85 (2013.01); *H01L 24/48* (2013.01); *H01L 2223/6655* (2013.01); *H01L 2224/04042* (2013.01); *H01L 2224/05013* (2013.01); *H01L 2224/06181* (2013.01); *H01L 2224/45016* (2013.01); *H01L 2224/48105* (2013.01); *H01L 2224/48227* (2013.01); *H01L 2924/00014* (2013.01); *H01L 2924/1421* (2013.01); *H01L 2924/19105* (2013.01); *H01L 2924/19107* (2013.01); *H01L 2924/3025* (2013.01)

(58) Field of Classification Search
CPC . H01L 2924/00014; H01L 2224/48227; H01L 2924/19105; H01L 2223/6655; H01L 2924/1421; H01L 2924/19107; H01L 2924/3025; H01L 2224/05013; H01L 2224/06181; H01L 2224/45016; H01L 24/48; H01L 2224/04042; H01L 2224/48105

See application file for complete search history.

(56) References Cited

U.S. PATENT DOCUMENTS

| | | |
|---|---|---|
| 2006/0186513 A1 | 8/2006 | Kitaguchi |
| 2007/0241440 A1 | 10/2007 | Hoang et al. |
| 2008/0014678 A1 | 1/2008 | Howard et al. |
| 2008/0055015 A1 | 3/2008 | Blednov |
| 2012/0222892 A1 | 9/2012 | Sun et al. |
| 2013/0021219 A1 | 1/2013 | Agarwal |
| 2013/0335288 A1 | 12/2013 | Read et al. |

* cited by examiner

METHODS FOR FORMING SHIELDED RADIO-FREQUENCY MODULES HAVING REDUCED AREA

CROSS-REFERENCE TO RELATED APPLICATION(S)

This application is a division of U.S. patent application Ser. No. 14/869,952 filed Sep. 29, 2015, entitled SHIELDED RADIO-FREQUENCY MODULE HAVING REDUCED AREA which claims priority to U.S. Provisional Application No. 62/058,039 filed Sep. 30, 2014, entitled SHIELDED RADIO-FREQUENCY MODULE HAVING REDUCED AREA, the disclosure of which is hereby expressly incorporated by reference herein in its entirety.

BACKGROUND

Field

The present disclosure relates to a shielded radio-frequency (RF) module.

Description of the Related Art

In many electronic applications, a radio-frequency (RF) module can be implemented as a packaged module. Such a packaged module can include a packaging substrate such as a laminate substrate, and various component(s) mounted thereon.

In some embodiments, the foregoing packaged RF module can include RF shielding features such as shielding wirebonds. Such shielding wirebonds can provide shielding functionality between a given location on the packaged RF module and another location external or internal to the module.

SUMMARY

According to some implementations, the present disclosure relates to a radio-frequency (RF) module that includes a packaging substrate configured to receive a plurality of components, and a plurality of shielding wirebonds implemented on the packaging substrate and configured to provide RF shielding functionality for one or more regions on the packaging substrate. The packaging substrate includes a first area associated with implementation of each shielding wirebond. The RF module further includes one or more devices mounted on the packaging substrate. The packaging substrate further includes a second area associated with mounting of each of the one or more devices. Each device is mounted with respect to a corresponding shielding wirebond such that the second area associated with the device overlaps at least partially with the first area associated with the corresponding shielding wirebond.

In some embodiments, the packaging substrate can include a laminate substrate.

In some embodiments, each of the shielding wirebonds can have a loop shape that is asymmetric or approximately symmetric. The packaging substrate can include first and second contact pads configured to secure first and second ends of the loop shaped shielding wirebond. Each of the one or more devices can be an SMT device configured to be mounted on first and second contact pads. The first area can be at least as large as a first elongated region having opposing ends defined by the first and second contact pads for the loop shaped shielding wirebond. The second area can be a second elongated region having opposing ends defined by the first and second contact pads for the SMT device. Each of the first and second contact pads for the loop shaped shielding wirebond can have a rectangular shape, such that the first elongated region has an approximately rectangular shape. Each of the first and second contact pads for the SMT device can have a rectangular shape, such that the second elongated region has an approximately rectangular shape. The first elongated shape and the second elongated shape can be arranged in an approximately perpendicular manner.

In some embodiments, the at least partial overlap can include at least some of the first or second contact pads for the SMT device being within the first elongated region. The at least partial overlap can further include at least some of the SMT device being within the first elongated region. A portion of the SMT device can be underneath the loop shaped shielding wirebond.

In some embodiments, the first area can include a first region between one contact pad for the loop shaped shielding wirebond and a contact pad for a neighboring loop shaped shielding wirebond. The second area can include a second region having opposing ends defined by the first and second contact pads for the SMT device.

In some embodiments, each of the shielding wirebonds can include a first end attached to the packaging substrate and a second end positioned above the packaging substrate to yield a single-ended shielding wirebond configuration. The packaging substrate can include a contact pad configured to secure the first end of the single-ended shielding wirebond to the packaging substrate. Each of the one or more devices can be an SMT device configured to be mounted on first and second contact pads. The first area can include a first region between the contact pad for the single-ended shielding wirebond and a contact pad for a neighboring single-ended shielding wirebond. The second area can be a second elongated region having opposing ends defined by the first and second contact pads for the SMT device.

In some teachings, the present disclosure relates to a method for fabricating a radio-frequency (RF) module. The method includes forming or providing a packaging substrate configured to receive a plurality of components, and mounting one or more devices on the packaging substrate such that the packaging substrate includes an area associated with mounting of each of the one or more devices. The method further includes forming a plurality of shielding wirebonds on the packaging substrate to provide RF shielding functionality for one or more regions on the packaging substrate, such that the packaging substrate includes an area associated with formation of each shielding wirebond. The mounting of each device is implemented with respect to a corresponding shielding wirebond such that the area associated with the device overlaps at least partially with the area associated with the corresponding shielding wirebond.

In some embodiments, the forming of the plurality of shielding wirebonds can include forming a plurality of double-ended shielding wirebonds. In some embodiments, at least one of the one or more devices can be mounted such that at least a portion of the area associated with mounting of the device is generally under a corresponding double-ended shielding wirebond. In some embodiments, at least one of the one or more devices can be mounted such that at least a portion of the area associated with mounting of the device is generally between two neighboring double-ended shielding wirebonds.

In some embodiments, the forming of the plurality of shielding wirebonds can include forming a plurality of single-ended shielding wirebonds. At least one of the one or more devices can be mounted such that at least a portion of the area associated with mounting of the device is generally between two neighboring single-ended shielding wirebonds.

In some implementations, the present disclosure relates to a wireless device that includes a transceiver and a radio-frequency (RF) module in communication with the transceiver and configured to process an RF signal. The RF module includes a packaging substrate configured to receive a plurality of components, and a plurality of shielding wirebonds implemented on the packaging substrate and configured to provide RF shielding functionality for one or more regions on the packaging substrate. The packaging substrate includes a first area associated with implementation of each shielding wirebond. The RF module further includes one or more devices mounted on the packaging substrate. The packaging substrate further includes a second area associated with mounting of each of the one or more devices. Each device is mounted with respect to a corresponding shielding wirebond such that the second area associated with the device overlaps at least partially with the first area associated with the corresponding shielding wirebond. The RF module further includes an antenna in communication with the RF module and configured to facilitate transmission or reception of the RF signal.

In some embodiments, the wireless device can be a cellular phone. The RF module can be smaller in size than a functionally comparable module in which the second area does not overlap with the first area.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
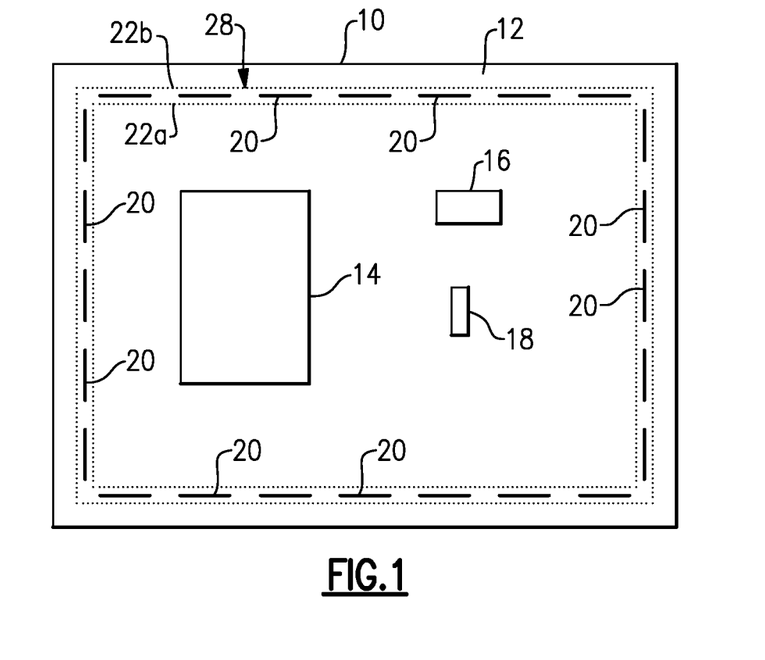
FIG. 1 shows an example shielding configuration that can be implemented for a radio-frequency (RF) module.
Figure 2:
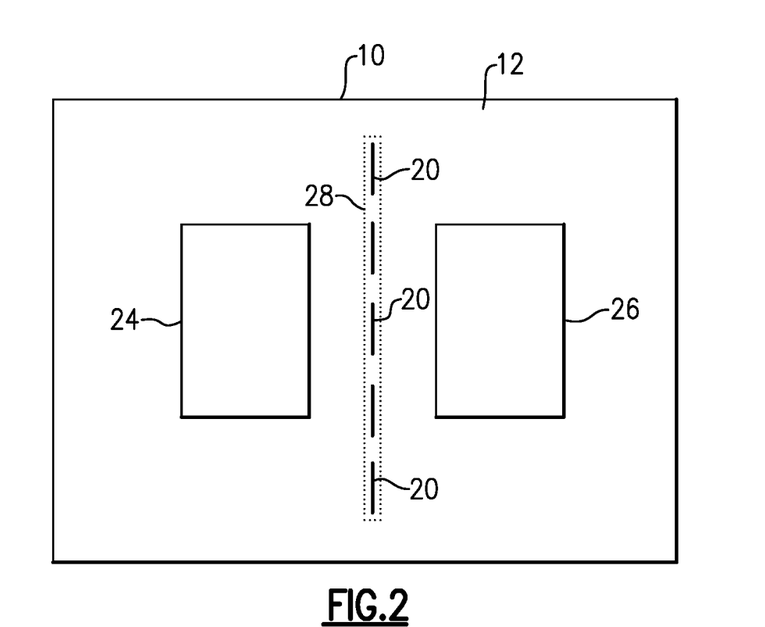
FIG. 2 shows another example shielding configuration that can be implemented for an RF module.

In some radio-frequency (RF) modules, shielding can be implemented with use of wirebonds. FIGS. 1 and 2 show examples of such RF shielding configurations. In the example of FIG. 1, an RF module 10 can include a packaging substrate 12 such as a laminate substrate. A number of devices can be mounted on such a packaging substrate. For example, a die 14 having an RF circuit can be mounted on the packaging substrate 12, and connections between the die 14 and the packaging substrate 12 can be implemented by, for example, wirebonds. In another example, one or more SMT devices (e.g., depicted as 16, 18) can also be mounted on the packaging substrate 12.

In the example of FIG. 1, a plurality of RF shielding wirebonds 20 are shown to be implemented near the periphery of the packaging substrate 12. Such RF shielding wirebonds can provide an electrical connection between a conductive layer (not shown) formed over the packaging substrate 12 (e.g., on an overmold structure and electrically connected to upper portions of the RF shielding wirebonds 20) and a ground plane (e.g., within the packaging substrate and electrically connected to lower portions of the RF shielding wirebonds 20), to thereby provide shielding functionality between a region generally within a boundary defined by the RF shielding wirebonds 20 and a region outside of the boundary.

FIG. 2 shows another example of an RF module 10 having RF shielding functionality. Similar to the example of FIG. 1, such a module can include a packaging substrate 12 such as a laminate substrate. A number of devices can be mounted on such a packaging substrate. For example, a first die 24 and a second die 26, each having an RF circuit, can be mounted on the packaging substrate 12, and connections between the die 24, 26 and the packaging substrate 12 can be implemented by, for example, wirebonds.

In the example of FIG. 2, a plurality of RF shielding wirebonds 20 are shown to be implemented between the first and second die 24, 26. Such RF shielding wirebonds can provide an electrical connection between a conductive layer (not shown) formed over the packaging substrate 12 (e.g., on an overmold structure and electrically connected to upper portions of the RF shielding wirebonds 20) and a ground plane (e.g., within the packaging substrate and electrically connected to lower portions of the RF shielding wirebonds 20), to thereby provide shielding functionality between the regions associated with the first and second die 24, 26.

In the examples of FIGS. 1 and 2, implementation of the respective shielding wirebonds 20 typically results in an area on the packaging substrate 12 that is not utilized for other purpose. In the example of FIG. 1, a band 28 about the boundary defined by the shielding wirebonds 20 can represent such an area (also referred to herein as a keep-out area). In the example of FIG. 2, a band 28 about the segment defined by the shielding wirebonds 20 can represent such a keep-out area.

Described herein are examples of how at least some of such keep-out areas can be utilized for other purpose, to thereby yield a more efficient use of space in RF modules. Advantageously, such an efficient use of space can yield smaller sized RF modules.

Figure 3:
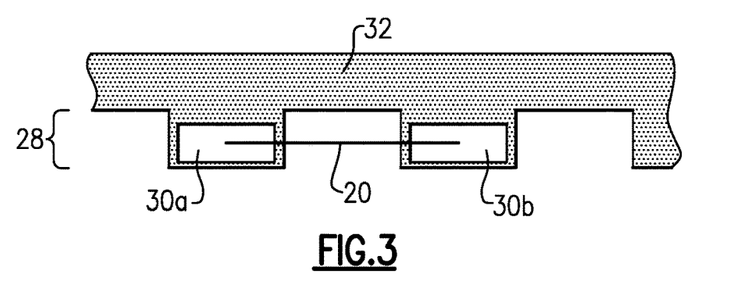
FIG. 3 shows a closer view of an example of how one or more shielding wirebonds can be implemented on a packaging substrate of an RF module.

FIG. 3 shows a closer view of an example of how a shielding wirebond 20 can be implemented on a packaging substrate. The view shown in FIG. 3 is a plan view; accordingly, the shielding wirebond 20 is depicted as a line. It will be understood that such a wirebond can have different shapes.

Figure 4A:
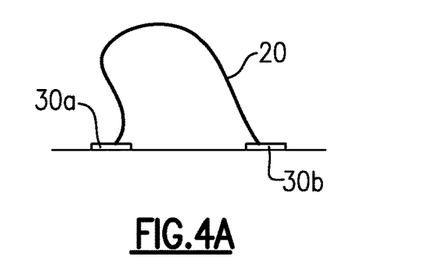
FIG. 4A shows a side view of an example shielding wirebond that can be implemented for the configuration of FIG. 3.

For example, FIG. 4A shows an example shielding wirebond 20 having an asymmetrical shape with two ends attached to the packaging substrate (32 in FIG. 3) through contact pads 30a, 30b. In another example, FIG. 4B shows an example shielding wirebond 20 having a symmetrical (or approximately symmetrical) shape with two ends attached to the packaging substrate (32 in FIG. 3) through contact pads 30a, 30b.

Referring to the example of FIG. 3, the shielding wirebond 20 is shown to be formed between two contact pads 30a, 30b. Such contact pads can be electrically connected to a grounding strip 32 which is in turn electrically connected to a ground plane (not shown in FIG. 3). In the context of the example shielding configuration of FIG. 1, the grounding strip 32 can form a grounding ring at or near the periphery of the packaging substrate 12. In the context of the example shielding configuration of FIG. 2, the grounding strip 32 can form a strip segment next to or underneath the segment defined by the shielding wirebonds.

In the example of FIG. 3, a keep-out region 28 can include at least a strip of area generally corresponding to the width needed to implement the contact pads 30a, 30b. Such a keep-out region can also include the grounding strip 32 for non-grounding use.

Figure 4B:
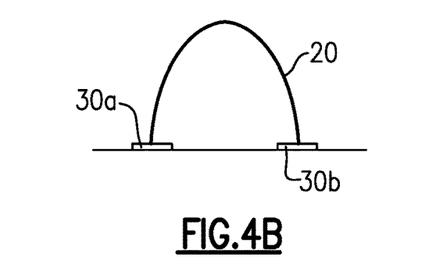
FIG. 4B shows a side view of another example shielding wirebond that can be implemented for the configuration of FIG. 3.

In the examples of FIGS. 3 and 4, the shielding wirebonds 20 have a double-ended configuration in which both ends of a given wirebond are attached to their respective contact pads. In some embodiments, a shielding wirebond can be attached to a packaging substrate in a single-ended manner, and one or more features of the present disclosure can also be implemented with respect to such a single-ended shielding wirebond.

Figure 5:
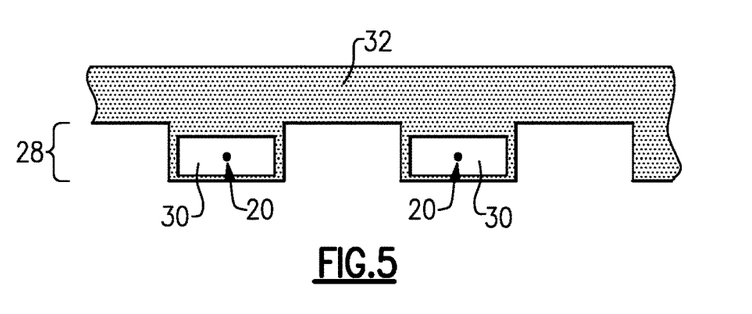
FIG. 5 shows a closer view of another example of how one or more shielding wirebonds can be implemented on a packaging substrate of an RF module.
Figure 6:
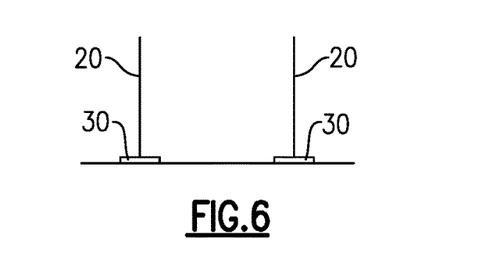
FIG. 6 shows a side view of example shielding wirebonds that can be implemented for the configuration of FIG. 5.

FIGS. 5 and 6 show plan and side views of example single-ended shielding wirebonds 20, where one end of each shielding wirebond is attached to its respective contact pad 30. Such a contact pad can be implemented on a grounding strip 32, such that the shielding wirebond 20 is electrically connected to a ground plane (e.g., within the packaging substrate. The other end of the shielding wirebond 20 is shown to remain generally above the contact pad 30. Such other end of the shielding wirebond 20 can be in electrical contact with a conductive layer (not shown) to provide a grounding connection between the conductive layer and the ground plane. Additional details concerning the example shielding wirebonds (double-ended or single-ended) can be found in, for example, U.S. Pat. No. 9,071,335 entitled RADIO-FREQUENCY MODULES HAVING TUNED SHIELDING-WIREBONDS, which is expressly incorporated by reference in its entirety.

Figure 7:
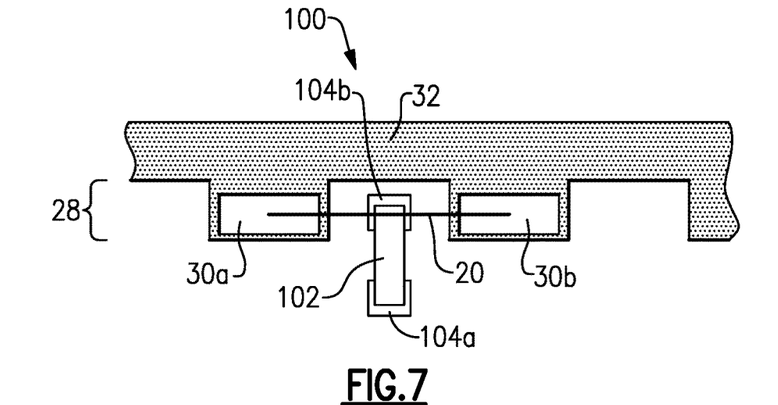
FIG. 7 shows an example shielding configuration in which an SMT device footprint can be at least partially within a keep-out area associated with a shielding wirebond.
Figure 8:
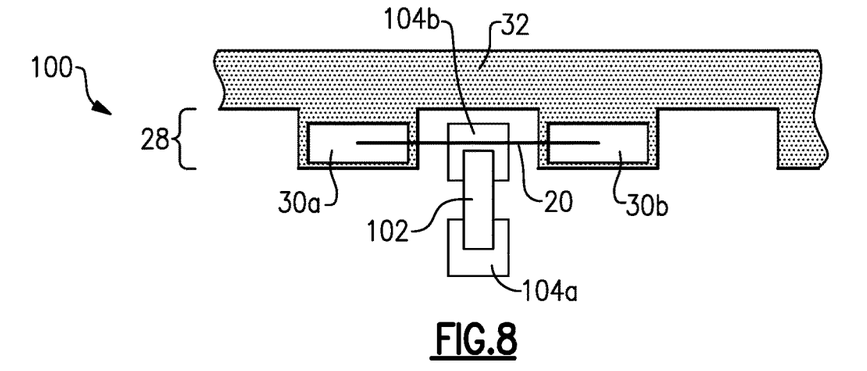
FIG. 8 shows another example shielding configuration in which a mounting area for an SMT device can be at least partially within a keep-out area associated with a shielding wirebond.
Figure 9:
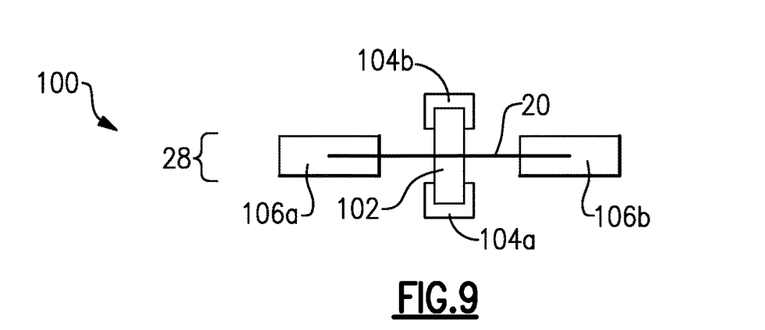
FIG. 9 shows another shielding configuration in which both sides of a shielding wirebond can be utilized for mounting of an SMT device.
Figure 10:
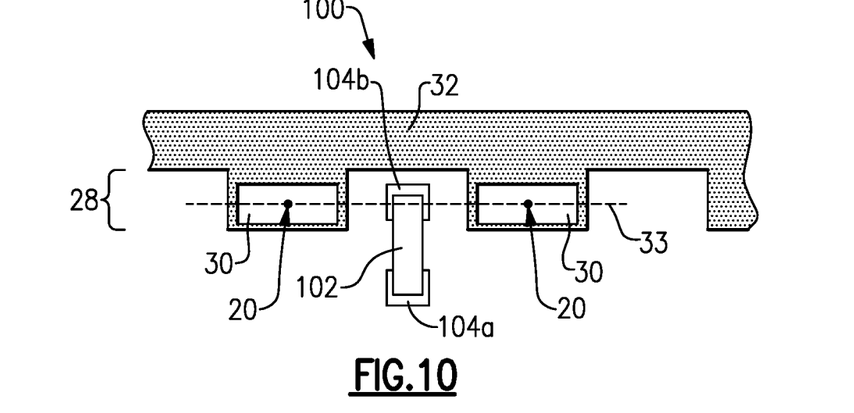
FIG. 10 shows an example shielding configuration in which an SMT device footprint can be at least partially within a keep-out area between two single-ended shielding wirebonds.
Figure 11:
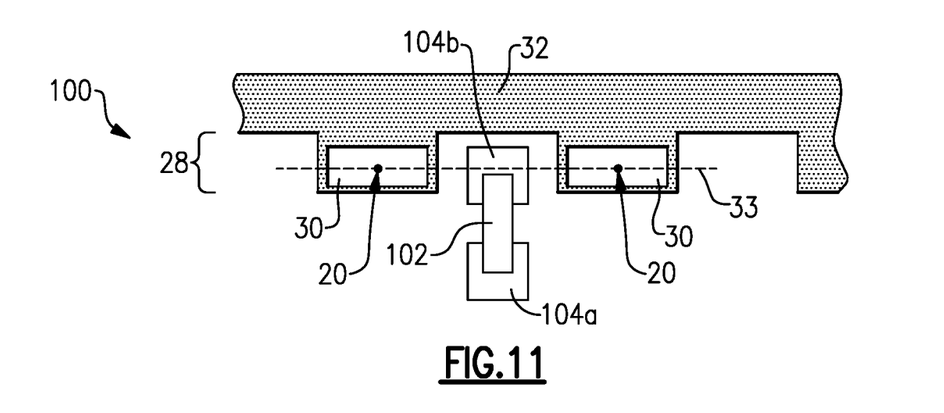
FIG. 11 shows another example shielding configuration in which a mounting area for an SMT device can be at least partially within a keep-out area between two single-ended shielding wirebonds.
Figure 12:
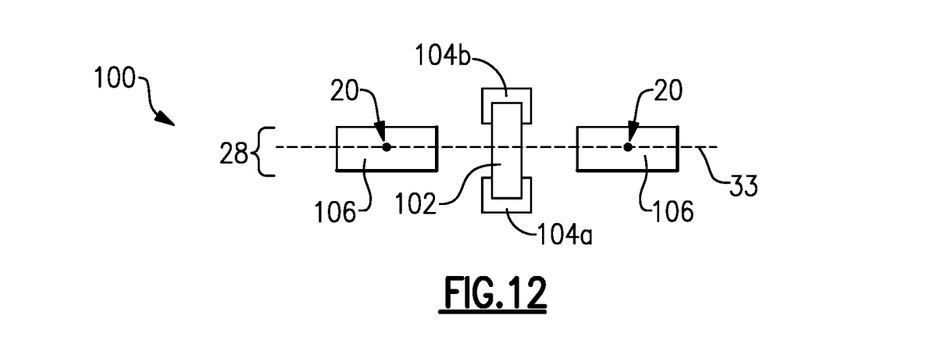
FIG. 12 shows another shielding configuration in which both sides of a line defined by two single-ended shielding wirebonds can be utilized for mounting of an SMT device.
Figure 13:
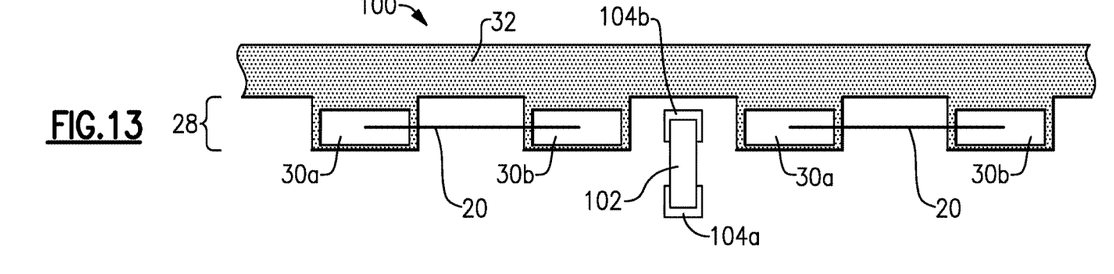
FIG. 13 shows an example shielding configuration in which an SMT device footprint can be at least partially within a keep-out area between two double-ended shielding wirebonds.
Figure 14:
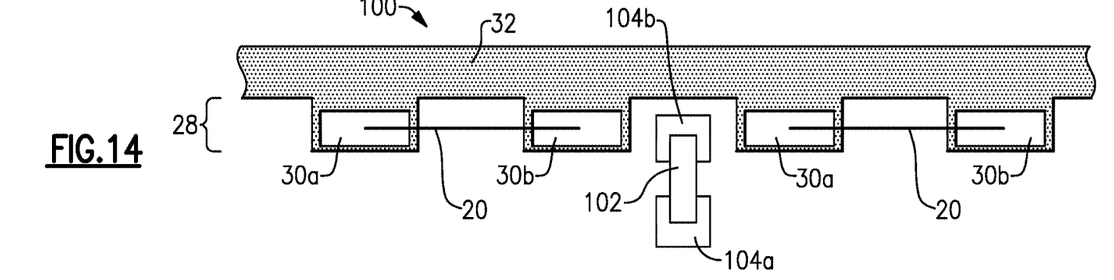
FIG. 14 shows another example shielding configuration in which a mounting area for an SMT device can be at least partially within a keep-out area between two double-ended shielding wirebonds.
Figure 15:
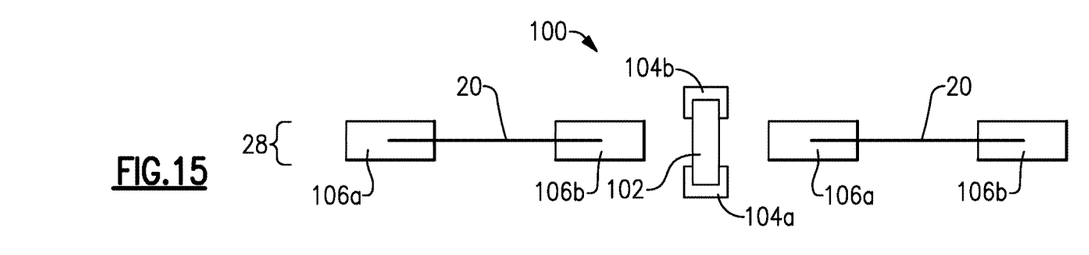
FIG. 15 shows another shielding configuration in which both sides of a line defined by two double-ended shielding wirebonds can be utilized for mounting of an SMT device.

FIGS. 7-15 show non-limiting examples of how at least some of a keep-out region on a packaging substrate can be utilized for a purpose other than RF shielding. FIGS. 7-9 show examples in the context of a shielding wirebond having a double-ended configuration, and a keep-out region utilized for mounting of a component being between the two ends of such a shielding wirebond. FIGS. 10-12 show examples in the context of a shielding wirebond having a single-ended configuration, and a keep-out region utilized for mounting of a component being adjacent to such a shielding wirebond. FIGS. 13-15 show examples in the context of a shielding wirebond having a double-ended configuration, and a keep-out region utilized for mounting of a component being adjacent to such a shielding wirebond.

In some embodiments, an area associated with mounting of a component (e.g., an SMT device) on the packaging substrate can partially or fully overlap with a keep-out area associated with implementation of one or more shielding wirebonds. The area associated with the mounting of the SMT device can include, for example, a footprint of the SMT itself, and footprint of one or more contact pads utilized for the mounting and electrical connections for the SMT device.

In FIGS. 7-9, the SMT device is indicated as 102, and the contact pads are indicated as 104a, 104b. It will be understood that there may be other numbers of contact pads associated with mounting of the SMT device 102. In some embodiments, the foregoing area associated with the mounting of the SMT device can include a net footprint formed by the SMT device 102 and/or the contact pads 104a, 104b. In some embodiments, the foregoing area associated with the mounting of the SMT device can include a smallest rectangle that covers the SMT device 102 and the contact pads 104a, 104b. For example, a rectangle having opposing ends defined by the contact pads 104a, 104b can be an area associated with the mounting of the SMT device.

In some embodiments, the foregoing keep-out area associated with implementation of one or more shielding wirebonds can include a strip generally indicated as 28. For a given double-ended shielding wirebond, such a keep-out area can include a rectangle having opposing ends defined by the contact pads (30*a*, 30*b* in FIGS. 7 and 8; 106*a*, 106*b* in FIG. 9). In some embodiments, the foregoing keep-out area associated with implementation of a shielding wirebond can further include an area associated with conductive features (e.g., tabs extending from the grounding strip 32) utilized to implement the contact pads for the shielding wirebond, whether in a net-footprint form or a smallest inclusive rectangle form.

FIGS. 7-9 show that in some embodiments, at least some of an area associated with the mounting of a SMT device 102 (also referred to herein as a mounting area) can overlap with a keep-out area associated with implementation of a shielding wirebond (also referred to herein as a keep-out area). In the example of FIG. 7, a shielding configuration 100 is shown to include an overlap between the mounting area and the keep-out area, such that one contact pad (104*b*) is substantially within the keep-out area (e.g., a rectangle having opposing ends defined by the contact pads 30*a*, 30*b*) and the SMT device footprint is partially within the keep-out area. In such a configuration, a portion of the SMT device 102 can be generally underneath the shielding wirebond 20.

In some embodiments, a shielding configuration can also include an overlap between the mounting area and the keep-out area, such that one contact pad (e.g., 104*b* in FIG. 7) is at least partially within the keep-out area (e.g., a rectangle having opposing ends defined by the contact pads 30*a*, 30*b*) and the SMT device footprint is substantially out of the keep-out area. In such a configuration, the SMT device 102 generally will not be underneath the shielding wirebond 20.

In the example of FIG. 8, a shielding configuration 100 is shown to include an overlap between the mounting area and the keep-out area, such that one contact pad (104*b*) is at least partially within the keep-out area (e.g., a rectangle having opposing ends defined by the contact pads 30*a*, 30*b*) and the SMT device footprint is also at least partially within the keep-out area. In such a configuration, a portion of the SMT device 102 may or may not be underneath the shielding wirebond 20.

In the examples of FIGS. 7 and 8, the grounding strip 32 occupies one side of the shielding wirebond 20. Accordingly, it may not be practical to utilize such an area for non-grounding purpose. However, there may be shielding applications where both sides of a shielding wirebond are generally free from such a grounding strip. In such a configuration, the shielding wirebond can be grounded through a lower layer so as to leave the upper surface of the packaging substrate generally free from grounding features (other than the related contact pads). FIG. 9 shows an example of such a shielding configuration.

In FIG. 9, a shielding configuration 100 is shown to allow use of both sides of a shielding wirebond 20 for mounting of an SMT device 102 more freely than the examples of FIGS. 7 and 8. Accordingly, a mid-portion of the SMT device 102 can be underneath the shielding wirebond 20, with contact pads 104*a*, 104*b* being positioned on opposing sides of the shielding wirebond 20. In such a configuration, the SMT device 102 can be at least partially within the keep-out area (e.g., a rectangle having opposing ends defined by the contact pads 106*a*, 106*b*). In the example shown, each of the contact pads 104*a*, 104*b* may or may not overlap with the keep-out area.

In the examples of FIGS. 7-9, the length-wise direction of the SMT device 102 is shown to be generally perpendicular to the plan-view extension direction of the corresponding shielding wirebond 20. Depending on the size of the SMT device, the size of corresponding contact pads, and/or the size of the shielding wirebond, such an SMT device can be oriented in other directions relative to the shielding wirebond.

In FIGS. 10-12, the SMT device is indicated as 102, and the contact pads are indicated as 104*a*, 104*b*. It will be understood that there may be other numbers of contact pads associated with mounting of the SMT device 102. In some embodiments, the foregoing area associated with the mounting of the SMT device can include a net footprint formed by the SMT device 102 and/or the contact pads 104*a*, 104*b*. In some embodiments, the foregoing area associated with the mounting of the SMT device can include a smallest rectangle that covers the SMT device 102 and the contact pads 104*a*, 104*b*. For example, a rectangle having opposing ends defined by the contact pads 104*a*, 104*b* can be an area associated with the mounting of the SMT device.

In some embodiments, the foregoing keep-out area associated with implementation of one or more shielding wirebonds can include a strip generally indicated as 28. For a given single-ended shielding wirebond, such a keep-out area can include a rectangle having opposing ends defined by neighboring contact pads (30 in FIGS. 10 and 11; 106 in FIG. 12). In some embodiments, the foregoing keep-out area associated with implementation of a shielding wirebond can further include an area associated with conductive features (e.g., tabs extending from the grounding strip 32) utilized to implement the contact pads for the shielding wirebonds, whether in a net-footprint form or a smallest inclusive rectangle form.

FIGS. 10-12 show that in some embodiments, at least some of an area associated with the mounting of a SMT device 102 (also referred to herein as a mounting area) can overlap with a keep-out area associated with implementation of a shielding wirebond (also referred to herein as a keep-out area). In the example of FIG. 10, a shielding configuration 100 is shown to include an overlap between the mounting area and the keep-out area, such that one contact pad (104*b*) is substantially within the keep-out area (e.g., a rectangle having opposing ends defined by the neighboring contact pads 30) and the SMT device footprint is partially within the keep-out area. In such a configuration, a portion of the SMT device 102 can be generally underneath a line 33 defined between two adjacent single-ended shielding wirebonds 20.

In some embodiments, a shielding configuration can also include an overlap between the mounting area and the keep-out area, such that one contact pad (e.g., 104*b* in FIG. 10) is at least partially within the keep-out area (e.g., a rectangle having opposing ends defined by the neighboring contact pads 30) and the SMT device footprint is substantially out of the keep-out area. In such a configuration, the SMT device 102 generally will not be underneath the line (e.g., 33 in FIG. 10) between two adjacent single-ended wirebonds 20.

In the example of FIG. 11, a shielding configuration 100 is shown to include an overlap between the mounting area and the keep-out area, such that one contact pad (104*b*) is at least partially within the keep-out area (e.g., a rectangle having opposing ends defined by the neighboring contact pads 30) and the SMT device footprint is also at least partially within the keep-out area. In such a configuration, a portion of the SMT device 102 may or may not be underneath the line 33 defined between two adjacent single-ended shielding wirebonds 20.

In the examples of FIGS. 10 and 11, the grounding strip 32 occupies one side of the line 33 defined by the shielding wirebonds 20. Accordingly, it may not be practical to utilize such an area for non-grounding purpose. However, there may be shielding applications where both sides of a line defined by shielding wirebonds are generally free from such a grounding strip. In such a configuration, the shielding wirebonds can be grounded through a lower layer so as to leave the upper surface of the packaging substrate generally free from grounding features (other than the related contact pads). FIG. 12 shows an example of such a shielding configuration.

In FIG. 12, a shielding configuration 100 is shown to allow use of both sides of a line 33 defined by single-ended shielding wirebonds 20 for mounting of an SMT device 102 more freely than the examples of FIGS. 10 and 11. Accordingly, a mid-portion of the SMT device 102 can be underneath the line 33, with contact pads 104a, 104b being positioned on opposing sides of the line 33. In such a configuration, the SMT device 102 can be at least partially within the keep-out area (e.g., a rectangle having opposing ends defined by the neighboring contact pads 106). In the example shown, each of the contact pads 104a, 104b may or may not overlap with the keep-out area.

In the examples of FIGS. 10-12, the length-wise direction of the SMT device 102 is shown to be generally perpendicular to the plan-view extension direction of the line 33 defined by the shielding wirebonds 20. Depending on the size of the SMT device, the size of corresponding contact pads, and/or the spacing between the shielding wirebonds, such an SMT device can be oriented in other directions relative to the shielding wirebonds.

It is noted that the examples of FIGS. 10-12 are related to utilizing at least some of a keep-out area between two neighboring single-ended shielding wirebonds. In some embodiments, such a configuration can also be implemented between neighboring double-ended shielding wirebonds. FIGS. 13-15 show examples of such a configuration.

In FIGS. 13-15, the SMT device is indicated as 102, and the contact pads are indicated as 104a, 104b. It will be understood that there may be other numbers of contact pads associated with mounting of the SMT device 102. In some embodiments, the foregoing area associated with the mounting of the SMT device can include a net footprint formed by the SMT device 102 and/or the contact pads 104a, 104b. In some embodiments, the foregoing area associated with the mounting of the SMT device can include a smallest rectangle that covers the SMT device 102 and the contact pads 104a, 104b. For example, a rectangle having opposing ends defined by the contact pads 104a, 104b can be an area associated with the mounting of the SMT device.

In some embodiments, the foregoing keep-out area associated with implementation of one or more shielding wirebonds can include a strip generally indicated as 28. For a given double-ended shielding wirebond, such a keep-out area can include a rectangle having opposing ends defined by neighboring contact pads (30b, 30a in FIGS. 13 and 14; 106b, 106a in FIG. 15). In some embodiments, the foregoing keep-out area associated with implementation of a shielding wirebond can further include an area associated with conductive features (e.g., tabs extending from the grounding strip 32) utilized to implement the contact pads for the shielding wirebonds, whether in a net-footprint form or a smallest inclusive rectangle form.

FIGS. 13-15 show that in some embodiments, at least some of an area associated with the mounting of a SMT device 102 (also referred to herein as a mounting area) can overlap with a keep-out area associated with implementation of a shielding wirebond (also referred to herein as a keep-out area). In the example of FIG. 13, a shielding configuration 100 is shown to include an overlap between the mounting area and the keep-out area, such that one contact pad (104b) is substantially within the keep-out area (e.g., a rectangle having opposing ends defined by the neighboring contact pads 30b, 30a) and the SMT device footprint is partially within the keep-out area. In such a configuration, a portion of the SMT device 102 can be generally underneath a line defined between two adjacent double-ended shielding wirebonds 20.

In some embodiments, a shielding configuration can also include an overlap between the mounting area and the keep-out area, such that one contact pad (e.g., 104b in FIG. 13) is at least partially within the keep-out area (e.g., a rectangle having opposing ends defined by the neighboring contact pads 30b, 30a) and the SMT device footprint is substantially out of the keep-out area. In such a configuration, the SMT device 102 generally will not be underneath the line between two adjacent double-ended wirebonds 20.

In the example of FIG. 14, a shielding configuration 100 is shown to include an overlap between the mounting area and the keep-out area, such that one contact pad (104b) is at least partially within the keep-out area (e.g., a rectangle having opposing ends defined by the neighboring contact pads 30b, 30a) and the SMT device footprint is also at least partially within the keep-out area. In such a configuration, a portion of the SMT device 102 may or may not be underneath the line defined between two adjacent double-ended shielding wirebonds 20.

In the examples of FIGS. 13 and 14, the grounding strip 32 occupies one side of the line defined by the shielding wirebonds 20. Accordingly, it may not be practical to utilize such an area for non-grounding purpose. However, there may be shielding applications where both sides of a line defined by shielding wirebonds are generally free from such a grounding strip. In such a configuration, the shielding wirebonds can be grounded through a lower layer so as to leave the upper surface of the packaging substrate generally free from grounding features (other than the related contact pads). FIG. 15 shows an example of such a shielding configuration.

In FIG. 15, a shielding configuration 100 is shown to allow use of both sides of a line defined by double-ended shielding wirebonds 20 for mounting of an SMT device 102 more freely than the examples of FIGS. 13 and 14. Accordingly, a mid-portion of the SMT device 102 can be underneath such a line, with contact pads 104a, 104b being positioned on opposing sides of the line. In such a configuration, the SMT device 102 can be at least partially within the keep-out area (e.g., a rectangle having opposing ends defined by the neighboring contact pads 106b, 106a). In the example shown, each of the contact pads 104a, 104b may or may not overlap with the keep-out area.

In the examples of FIGS. 13-15, the length-wise direction of the SMT device 102 is shown to be generally perpendicular to the plan-view extension direction of the line defined by the shielding wirebonds 20. Depending on the size of the SMT device, the size of corresponding contact pads, and/or the spacing between the shielding wirebonds, such an SMT device can be oriented in other directions relative to the shielding wirebonds.

In the various examples described in reference to FIGS. 7-15, the shielding wirebonds are depicted as being implemented in a double-ended or single-ended configuration. Further, various uses of keep-out areas are described as being generally underneath a double-ended shielding wirebond, or as being generally between neighboring shielding wirebonds (single-ended or double-ended). However, it will be understood that a shielding configuration can include any combination of one or more single-ended shielding wirebonds and one or more double-ended shielding wirebonds. Accordingly, use of keep-out areas in such a shielding configuration can include any combination of the examples described herein.

It will also be understood that even if a given shielding configuration involves only one type of shielding wirebonds (e.g., single-ended or double-ended), use of keep-out areas in such a shielding configuration can include any combination of the examples described herein.

In some applications, the vertical and/or side dimensions of a shielding wirebond, and/or spacings between shielding wirebonds, can be adjusted to provide effective shielding for intended frequencies. There may be a range of such dimensions/spacings in which effective shielding can be provided. Accordingly, dimensions of a loop profile of the shielding wirebond can be selected to provide effective shielding functionality, and to allow such a loop to be formed over an SMT device and/or related contact features. Similarly, spacing between shielding wirebonds can be selected to provide effective shielding functionality, and to allow mounting of an SMT device and/or related contact features. Such flexibility in dimensioning/spacing associated with shielding wirebond(s) can allow a number of different sized SMT devices to be mounted in areas that are traditionally in keep-out areas. Accordingly, significant savings in area can be realized. Such savings in area can result in smaller sized RF modules without sacrificing shielding performance, which in turn can yield improved products such as wireless devices.

Figure 16:
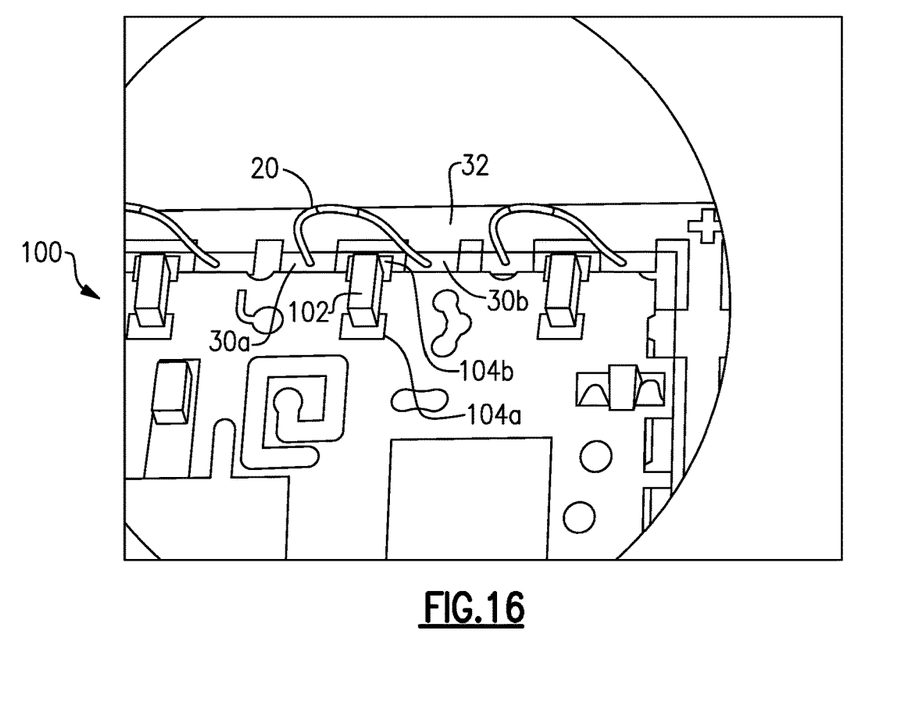
FIG. 16 shows a perspective view of an example shielding configuration having one or more features as described herein.
Figure 17:
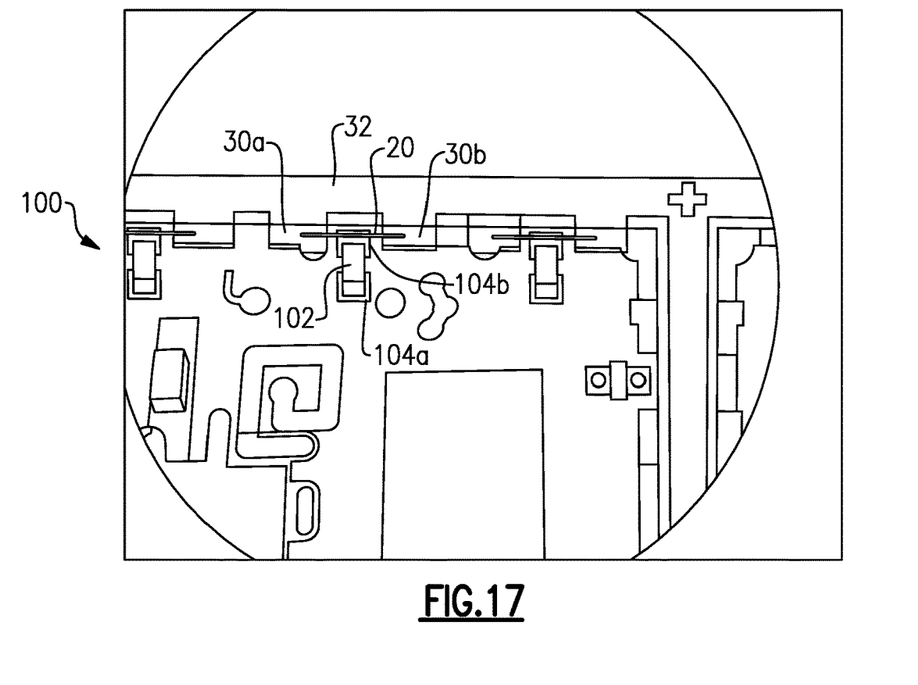
FIG. 17 shows a plan view of the example shielding configuration of FIG. 16.

FIG. 16 shows a perspective view of a shielding configuration 100 having one or more features as described herein. FIG. 17 shows a plan view of the same example shielding configuration 100. In the example of FIGS. 16 and 17, shielding wirebonds 20 are shown to be grounded through, for example, contact pads 30a, 30b and a grounding strip 32. An area under each of the shielding wirebonds 20 is shown to be utilized for mounting of an SMT device 102 (with contact pads 104a, 104b) as described herein. Although each shielding wirebond 20 shown in FIGS. 16 and 17 is shown to be utilized in such a manner, it will be understood that not all shielding wirebonds on a given packaging substrate need to have an SMT or other device mounted thereunder.

Figure 18:
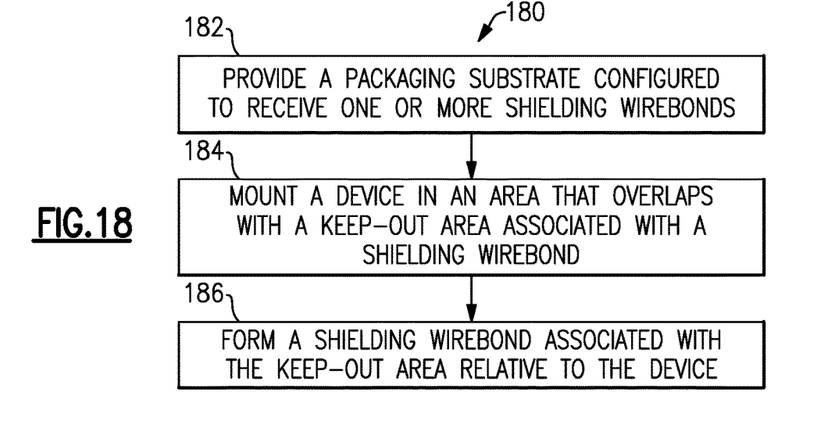
FIG. 18 shows a process that can be implemented to fabricate an RF module having one or more features as described herein.

FIG. 18 shows a process 180 that can be implemented to fabricate an RF module having one or more features as described herein. In block 182, a packaging substrate can be formed or provided. Such a packaging substrate can be configured to receive a plurality of shielding wirebonds. In block 184, a device such as an SMT device can be mounted in an area that overlaps with a keep-out area associated with a shielding wirebond. In block 186, a shielding wirebond associated with the keep-out area can be formed relative to the device.

Figure 19:
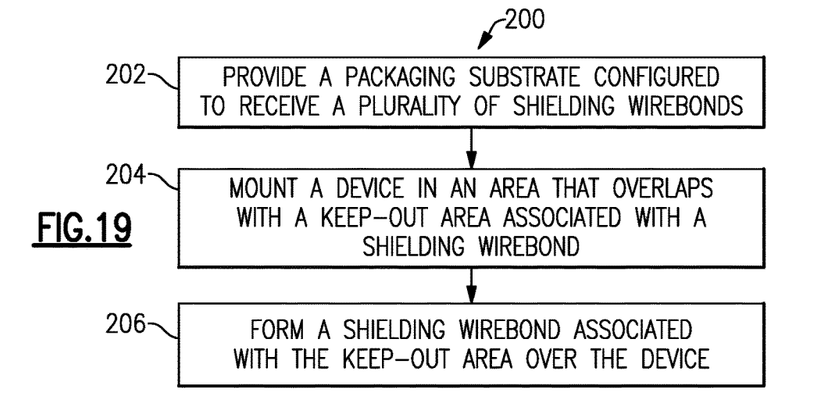
FIG. 19 shows a process that can be implemented as an example of the process of FIG. 18.

FIG. 19 shows a process 200 that can be implemented as an example of the process 180 of FIG. 18. In block 202, a packaging substrate can be formed or provided. Such a packaging substrate can be configured to receive a plurality of shielding wirebonds. In block 204, a device such as an SMT device can be mounted in an area that overlaps with a keep-out area associated with a shielding wirebond. In block 206, a shielding wirebond associated with the keep-out area can be formed over the device.

Figure 20:
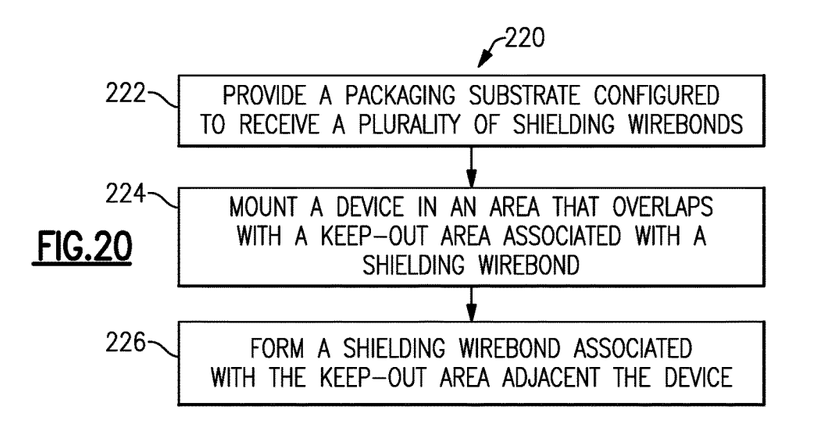
FIG. 20 shows a process that can be implemented as another example of the process of FIG. 18.

FIG. 20 shows a process 220 that can be implemented as another example of the process 180 of FIG. 18. In block 222, a packaging substrate can be formed or provided. Such a packaging substrate can be configured to receive a plurality of shielding wirebonds. In block 224, a device such as an SMT device can be mounted in an area that overlaps with a keep-out area associated with a shielding wirebond. In block 226, a shielding wirebond associated with the keep-out area can be formed adjacent the device.

As described herein, one or more keep-out areas on a packaging substrate can be utilized for mounting of device(s) such as SMT device(s). Such utilization of space on the packaging substrate can allow more flexibility in use of limited available area on the packaging substrate. Benefits resulting from such design flexibility can include, for example, reduced lateral dimensions of the packaging substrate, and therefore, reduced size of the corresponding packaged module.

Figure 21:
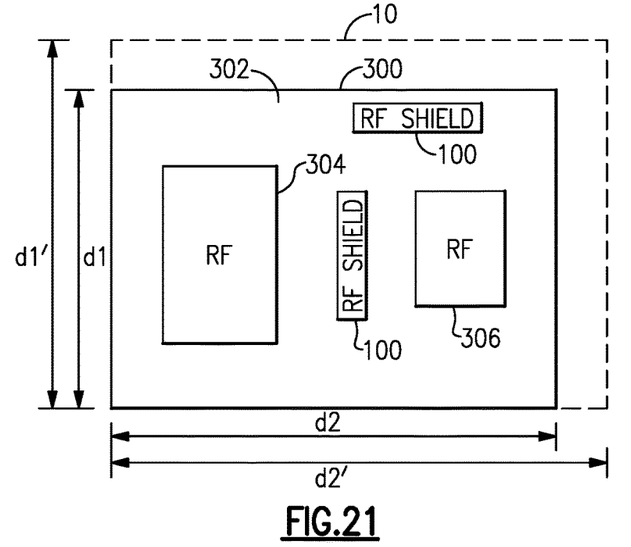
FIG. 21 depicts an RF module having one or more advantageous features described herein.

FIG. 21 depicts a packaged module 300 (e.g., an RF module) in which an RF shielding configuration 100 as described herein is implemented at one or more locations on a packaging substrate 302. Such a packaging substrate can be configured to receive a plurality of components, including one or more die having RF circuit(s) (e.g., 304, 306), and a plurality of SMT components. As described herein, at least some of such SMT components can be implemented with the one or more shielding configurations 100.

FIG. 21 further shows that the packaged RF module 300 can benefit from a reduced size (e.g., d1×d2) relative to a functionally comparable packaged RF module 10 (e.g., d1×d2') that does not utilize its keep-out space. It is noted that if a plurality of such reduced-sized packaged modules are implemented on a circuit board such as a phone board, space saving can be even greater than that provided by one module.

In some implementations, a device and/or a configuration having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 22:
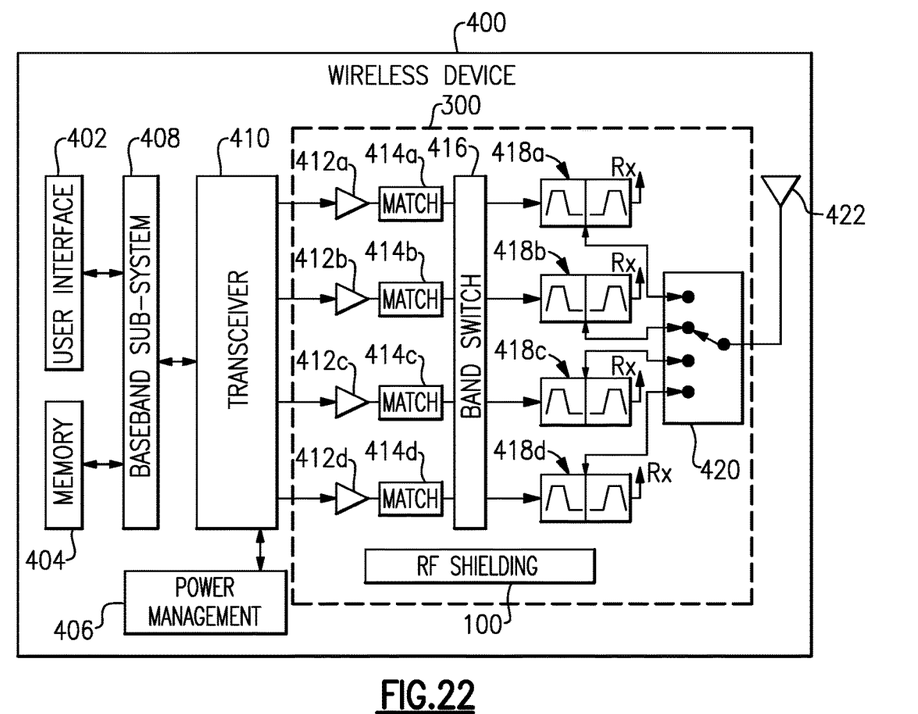
FIG. 22 depicts an example wireless device having one or more advantageous features described herein.

FIG. 22 depicts an example wireless device 400 having one or more advantageous features described herein. In the context of a module having one or more features as described herein, such a module can be generally depicted by a dashed box 300, and can be implemented as a front-end module (FEM). Other modules in the wireless device 400 can also benefit from implementation of one or more features as described herein. In the example of FIG. 22, the module 300 is shown to include a RF shielding configuration 100 having one or more features as described herein.

PAs 412 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 412 are shown to be matched (via respective match circuits 414) and routed to an antenna 422 through a band selection switch 416, their respective duplexers 418 and an antenna switch 420. In some embodiments, each duplexer 418 can allow transmit and receive operations to be performed simultaneously using a common antenna (e.g., 422). In FIG. 22, received signals are shown to be routed to "Rx" paths (not shown) that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for fabricating a radio-frequency module, the method comprising:
   forming or providing a packaging substrate configured to receive a plurality of components;
   mounting one or more devices on the packaging substrate such that the packaging substrate includes a first area associated with mounting of each of the one or more devices; and
   forming a plurality of shielding wirebonds on the packaging substrate to provide radio-frequency shielding functionality for one or more regions on the packaging substrate, such that the packaging substrate includes a second area associated with formation of each shielding wirebond, the mounting of each device implemented with respect to a corresponding shielding wirebond such that a portion of the first area associated with the device is partially surrounded by a portion of the second area associated with the corresponding shielding wirebond.

2. The method of claim 1 further comprising forming each of the shielding wirebonds to have a loop shape that is asymmetric or approximately symmetric.

3. The method of claim 2 wherein the packaging substrate includes first and second contact pads configured to secure first and second ends of the loop shaped shielding wirebond.

4. The method of claim 3 wherein each of the one or more devices is an SMT device configured to be mounted on third and fourth contact pads.

5. The method of claim 4 wherein the second area is at least as large as a first elongated region having opposing ends defined by the first and second contact pads for the loop shaped shielding wirebond.

6. The method of claim 5 wherein the first area is a second elongated region having opposing ends defined by the third and fourth contact pads for the SMT device.

7. The method of claim 5 wherein each of the first and second contact pads for the loop shaped shielding wirebond has a rectangular shape, such that the first elongated region has an approximately rectangular shape.

8. The method of claim 6 wherein each of the third and fourth contact pads for the SMT device has a rectangular shape, such that the second elongated region has an approximately rectangular shape.

9. The method of claim 5 wherein the portion of the first area that is partially surrounded by the portion of the second area includes at least some of the third or fourth contact pads for the SMT device located within the first elongated region.

10. The method of claim 9 wherein the portion of the first area that is partially surrounded by the portion of the second area further includes at least some of the SMT device located within the first elongated region.

11. The method of claim 10 wherein a portion of the SMT device is underneath the loop shaped shielding wirebond.

12. The method of claim 4 wherein the second area includes a first region between a contact pad for the loop shaped shielding wirebond and a contact pad for a neighboring loop shaped shielding wirebond.

13. The method of claim 12 wherein the first area includes a second region having opposing ends defined by the third and fourth contact pads for the SMT device.

14. The method of claim 1 further comprising attaching a first end of each of the shielding wirebonds to the packaging substrate and positioning a second end of each of the shielding wirebonds above the packaging substrate to yield one or more single-ended shielding wirebond configurations.

15. The method of claim 14 wherein the packaging substrate includes a contact pad configured to secure the first end of a single-ended shielding wirebond to the packaging substrate.

16. The method of claim 15 wherein each of the one or more devices is an SMT device configured to be mounted on first and second contact pads.

17. The method of claim 16 wherein the second area includes a first region between the contact pad for the single-ended shielding wirebond and a contact pad for a neighboring single-ended shielding wirebond.

18. The method of claim 17 wherein the first area is a second elongated region having opposing ends defined by the first and second contact pads for the SMT device.

19. A method for fabricating a radio-frequency module, the method comprising:
  forming or providing a packaging substrate configured to receive a plurality of components;
  mounting one or more devices on a first area of the packaging substrate; and
  forming a respective shielding wirebond for each of the one or more devices on a second area of the packaging substrate to provide radio-frequency shielding functionality, the respective shielding wirebond formed over a respective device mounted partially within a keep-out area associated with the respective wirebond.

20. A method for fabricating a radio-frequency module, the method comprising:
  forming or providing a packaging substrate configured to receive a plurality of components;
  mounting one or more devices on a first area of the packaging substrate; and
  forming a respective shielding wirebond for each of the one or more devices on a second area of the packaging substrate to provide radio-frequency shielding functionality, the respective shielding wirebond formed over adjacent to a respective device mounted partially within a keep-out area associated with the respective wirebond.

* * * * *